(12) United States Patent
Chen et al.

(10) Patent No.: US 11,094,690 B2
(45) Date of Patent: Aug. 17, 2021

(54) ON-CHIP IEC ESD PROTECTION USING PARASITIC PNP DEVICES

(71) Applicant: BOARD OF TRUSTEES OF THE UNIVERSITY OF ARKANSAS, Fayetteville, AR (US)

(72) Inventors: Zhong Chen, Fayetteville, AR (US); Farzan Farbiz, Santa Clara, CA (US)

(73) Assignee: Board Of Trustees Of The University Of Arkansas, Fayetteville, AR (US)

(*) Notice: Subject to any disclaimer, the term of this patent is extended or adjusted under 35 U.S.C. 154(b) by 0 days.

(21) Appl. No.: 16/580,733

(22) Filed: Sep. 24, 2019

(65) Prior Publication Data
US 2020/0098742 A1 Mar. 26, 2020

Related U.S. Application Data

(60) Provisional application No. 62/735,762, filed on Sep. 24, 2018.

(51) Int. Cl.
*H01L 27/02* (2006.01)

(52) U.S. Cl.
CPC ................ *H01L 27/0262* (2013.01)

(58) Field of Classification Search
CPC ............. H01L 27/098; H01L 27/0248; H01L 27/0251; H01L 27/0255; H01L 27/0259; H01L 27/0262; H01L 23/60; H01L 29/66121
See application file for complete search history.

(56) References Cited

U.S. PATENT DOCUMENTS

| | | | | |
|---|---|---|---|---|
| 2003/0234405 A1* | 12/2003 | Lai | ........... | H01L 27/0262 257/107 |
| 2006/0152868 A1* | 7/2006 | Ker | ........... | H01L 29/0649 361/56 |
| 2010/0133583 A1* | 6/2010 | Mawatari | ........... | H01L 27/0259 257/173 |
| 2013/0341705 A1* | 12/2013 | Raghavan | ........... | H01L 29/1095 257/328 |
| 2014/0339601 A1* | 11/2014 | Salcedo | ........... | H01L 29/7436 257/140 |
| 2015/0108538 A1* | 4/2015 | Chen | ........... | H01L 27/0248 257/132 |
| 2017/0179110 A1* | 6/2017 | Lee | ........... | H01L 29/7436 |
| 2018/0301445 A1* | 10/2018 | Yam | ........... | H01L 27/0262 |

OTHER PUBLICATIONS

ESD Association Standard Test Method ESD STM5.1-2001. Electrostatic discharge sensitivity testing—human body model (HBM)—component level, ESD Assoc; 2001; 19 pages.
IEC 61000 Electromagnetic Compatibility (EMC) Part 4-2: Testing and measurement techniques—Electrostatic discharge immunity test Basic EMC Publication, Jan. 23, 1998; 42 pages.
(Continued)

*Primary Examiner* — Khiem D Nguyen
(74) *Attorney, Agent, or Firm* — Keith A Vogt; Keith Vogt, Ltd.

(57) ABSTRACT

A semiconductor device having a P type substrate, an N type layer on the P type substrate that forms a PN junction therewith and the P type region, N type region and P type substrate form at least one parasitic PNP transistor.

14 Claims, 3 Drawing Sheets

(56) References Cited

OTHER PUBLICATIONS

Texas Instruments; ISO10605; Road vehicles—Test methods for electrical disturbances from electrostatic discharge; Application Report; SLVA954; Jul. 2018; 6 pages.

Morishita Y. A PNP-triggered SCR with improved trigger techniques for high- speed I/O ESD protection in deep submicron CMOS LSIs. In: Proceedings of the EOS/ESD symposium; 2005. p. 400-6; 7 pages.

Sarbishaei H, Lubana S, Semenov O, Sachdev M. A darlington-based SCR ESD protection device for high speed applications. In: Proceedings of the IEEE Inter Rel. Phys. Symp.; 2008. p. 633-4; 2 pages.

Kang M, Song KW, Chung H, Kim J, Lee YT, Kim C. SCR-based ESD protection for high bandwidth DRAMs. In: Proceedings of the IEEE Asian Solid-State Circuits Conference; 4 pages; 2007. p. 208-11.

G. Boselli and J. Brodsky, "The very unusual case of the IEC-robust IC with low HBM performance," EOS/ESD Symposium, 2013, pp. 1-7; 7 pages.

G. Boselli, A. Salman, J. Brodsky, and H. Kunz, "The relevance of long-duration TLP stress on system level ESD design", in Proceedings of 32nd EOS/ESD Symposium, EOS/ESD 2010, pp. 1-10; 10 pages.

Amerasekera et al; ESD in Silicon Integrated Circuits; Second Edition; 2002; 421 pages; John Wiley & Sons, Ltd.

S. Dabral, R. Aslett, and T. Maloney, "Designing on-chip power supply coupling diodes for ESD protection and noise Immunity," in EOS/ESD Symp. Proc., 1993, pp. 239-249; 17 pages.

5. Dabral, R. Aslett, and T. Maloney, "Core clamps for low voltage technologies," in EOS/ESD Symp. Proc., 1994, pp. 141-149; 10 pages.

T. Maloney and S. Dabral, "Novel clamp circuits for IC power supply protection," in Proc. 1995 EOS/ESD Symp., pp. 1-12; IEEE Trans. Comp., Packag., Manufact. Technol. C, vol. 19, pp. 150-161, 1996; 12 pages.

S. Voldman and G. Gerosa, "Mixed-voltage interface ESD protection circuits for advanced microprocessors in shallow trench and LOCOS isolation CMOS technologies," in IEEE Int. Electron Devices Meet. Proc., 1994, pp. 277-280; 4 pages.

Bhathia K, Rosenbaum E. Layout guidelines for optimized ESD protection diodes. In: Proceedings of the EOS/ESD symposium; 2007. p. 19-27 9 pages.

Voldman S, Gross V. Scaling, optimization, and design considerations of electrostatic discharge protection circuits in CMOS technology. In: Proceedings of the EOS/ESD symposium; 1994; 35 pages.

* cited by examiner

US 11,094,690 B2

ON-CHIP IEC ESD PROTECTION USING PARASITIC PNP DEVICES

RELATED APPLICATIONS

This application claims priority to U.S. Provisional Application Ser. No. 62/735,762 filed Sep. 24, 2019, and is hereby incorporated herein by reference in its entirety.

STATEMENT REGARDING FEDERALLY SPONSORED RESEARCH & DEVELOPMENT

Not applicable.

INCORPORATION BY REFERENCE OF MATERIAL SUBMITTED ON A COMPACT DISC

Not applicable.

BACKGROUND OF THE INVENTION

Electrostatic discharge (ESD) has been identified as one of the most significant reliability issues to ICs and systems. IC-level ESD standards (e.g., Human Body Model and Charge Device Model (CDM)) are used to determine the sensitivity of components and integrated circuits to degradation or damage under the ESD conditions during human or machine handling, System-level ESD tests (e.g., IEC 61000-4-2, IS0106056) are defined to assess the robustness of end-user products to ESD events that can occur during product operations. Although system-level ESD tests are not typically intended to be applied directly to ICs, many system manufacturers have started to request system-level ESD robustness at the IC level to reduce component on board and to shrink PCB area. This trend brings numerous design and reliability challenges to IC manufacturers. For example, typical system-level 8 kV IEC ESD stresses have twenty times more peak current and a ten-times faster rise-time than an IC-level 2 kV HBM stress.

High-speed interface ICs are more susceptible to system-level testing due to thin gate oxide thickness and low junction breakdown voltage. Furthermore, system-level tests are performed under powered-on conditions. The system board design, on-board components, and circuits conditions can alter the waveform of the IEC ESD tests. Therefore, on-chip ESD protections for system-level ESD requirements need much larger chip area (e.g., over 0.2 mm$^2$) than those for IC-level ESD tests to increase the power handling and to reduce the on-resistance of ESD structures. The large chip area of ESD structures will not only increase the cost but also impact the circuit performance. The parasitic capacitance and junction leakage current are increased due to large device footprints. The situation is even worse when system-level ESD requirements are requested for high-speed interface ICs.

In order to meet the stringent pin requirements for the high-speed interface ICs, the capacitance, leakage current, device area and protection window of ESD protection structures need to be well-defined. Current research on system-level on-chip ESD protections has mainly been focused on improving and tailoring the device parameters (e.g., failure current It2, trigger voltage Vt1 and hold voltage Vh) of area-efficient efficient primary IEC ESD cells (e.g., silicon control rectifier (SCR) structures). Although SCR structures have high It2 per device area, the low Vh and over-shooting of the Vt1 under strong injection conditions (i.e., system-level ESD testing) can create serious concerns and problems for normal operations and ESD protection.

ICs designed for interface connections, such as USB, HDMI, DisplayPort, and Lightning ports, typically have the system-level ESD requirements due to their direct exposures to the user environment. To guarantee a fast data transfer rate in the high-speed interface ICs, the parasitic capacitance from the data pins to the chip ground and power supply needs to be minimized. No series resistance is allowed for high-speed pins either, which makes the ESD protection window even smaller. Furthermore, the leakage current needs to be controlled to limit the standby power consumptions. Therefore, dual-diodes based IEC ESD protection, as shown in FIG. 1, are widely implemented for high-speed interface ICs.

As shown in FIG. 1, a pair of high-side diodes 100A and 100B and low-side diodes 102A and 102B on each IO pin 104A and 104B may be used to direct the ESD current 106A and 106B from the IO pins to VDD power rails 108A and 108B and GND power rails 109A and 109B through the primary ESD cell 111. Two or more IO pins can share one primary ESD cell to save the total device area. The IEC ESD current discharge paths are shown as dotted lines 110A and 110B in FIG. 1. The parasitic capacitance and leakage current on the IO pins are contributed by the capacitance and leakage of both diodes, which are mainly affected by the area of the diodes. The areas of the diodes and primary ESD cell are determined by the maximum ESD current (e.g., 30A) discharged through it. Typical IEC ESD structures require tremendous device area for both diodes and primary ESD cell, as well as the metal interconnects. The total area of ESD protection structures (diodes, primary ESD cell, and metal interconnects) could take nearly one-third of the chip area for high-speed interface ICs. Therefore, advancing the on-chip IEC ESD protection for high-speed interface ICs will have significant effects in reducing the cost and improving the performance and reliability of high-speed interface IC designs in real applications.

BRIEF SUMMARY OF THE INVENTION

In one embodiment, the present invention provides a method, system, approach and solution that provide ESD protection for high-speed interface ICs (e.g., USB host controller ICs) that require both IC-level (e.g., HBM) and system-level (e.g., IEC) ESD protections due to system exposures to static electricity discharges. On-chip ESD protection for high-speed interface ICs is difficult due to the stringent pin requirements (i.e., low capacitance and no series resistance). Specifically, the ESD designs for system-level ESD requirements are more challenging because of the high discharge current (~30 A), limited type of ESD components and narrow protection window. Although system-level stress that reaches ICs will vary according to the board-level components and PCB layout, on-chip IEC ESD protection structures typically require a tremendous amount of chip area (e.g., over 0.2 mm$^2$). Therefore, area-efficient IEC ESD and low-capacitance HBM ESD protection for high-speed interface ICs are highly desired to improve the robustness and reliability of the circuit design.

In other embodiments, the present invention provides innovative approaches that utilize parasitic components in the widely-used dual-diodes ESD protection structures in high-speed interface ICs. Area-efficient robust dual-diode structures can be integrated with different types of primary ESD cells other than SCR devices to reduce the impacts to the circuit performance and meet specific pin requirements.

In other embodiments, the present invention provides area-efficient rail-based ESD protection structures that utilize the parasitic bipolar structure (i.e. substrate PNP structure formed between the high-side ESD diode and the chip substrate).

In other embodiments, the present invention provides a protection structure wherein the structure is implemented in high-speed or digital designs due to small capacitance and low leakage current.

In other embodiments, the present invention provides a protection structure of wherein the structure is integrated with different types of primary ESD cells other than SCR devices to reduce the impacts to the circuit performance and meet specific pin requirements.

In other embodiments, the present invention provides an area-efficient rail-based ESD protection structure that utilizes alternative fingers of N+ and P+ diffusions in a high-side diode using P+/N-well junction.

In other embodiments, the present invention provides an area-efficient rail-based ESD protection structure that utilizes a plurality of PNP structures.

In other embodiments, the present invention provides a protection structure of wherein the current gain of the parasitic PNP structures can be adjusted through varying the width and doping for the emitter and base.

In other embodiments, the present invention provides a protection structure wherein the structure uses dual-diodes in an island configuration.

In other embodiments, the present invention provides a protection structure further including an N+ floating region to the right side of P+ diffusion in the p substrate.

In other embodiments, the present invention provides a protection structure further including an N+ bridging between p substrate and n-well.

In other embodiments, the present invention provides an area-efficient rail-based ESD protection structure that creates one or more additional parallel ESD discharging paths formed by parasitic PNP that inherently exists in the rail-based ESD structure.

In other embodiments, the present invention provides, instead of a PNP arrangement, a semiconductor device comprising a substrate made of a first semiconductor material, a first layer made of a second semiconductor material on the substrate, the second semiconductor material having a polarity opposite of the first semiconductor material. Also, the first layer forms a positive-negative junction with the substrate. Also provided is at least one region made of the first semiconductor material formed in the first layer and serving as the emitter of at least one parasitic transistor formed by the first region, the first layer and the substrate. Lastly, the semiconductor device may further include a plurality of parasitic transistors.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

Figure 2:
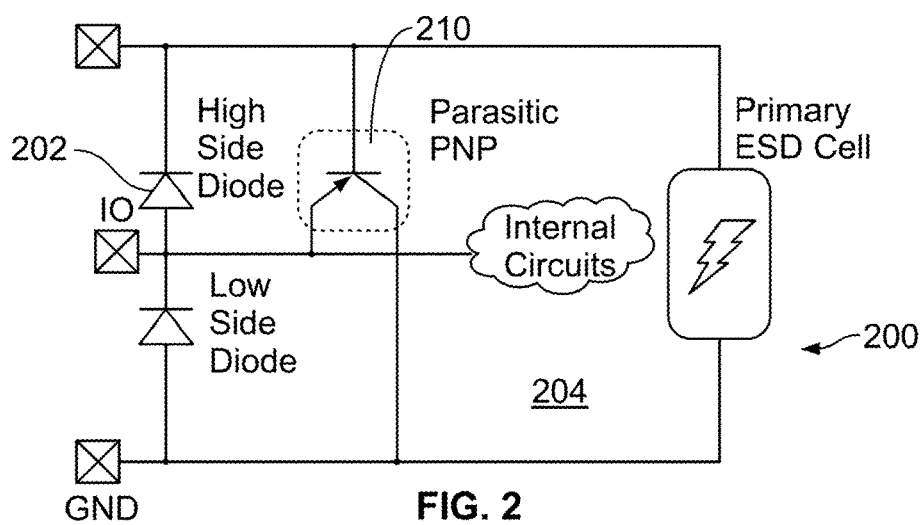
FIG. 2 illustrates a rail-based ESD protection scheme with a parasitic PNP device for an embodiment of the present invention.

In one embodiment, as shown in FIG. 2, the present invention proposes a novel area-efficient rail-based ESD protection structure 200 by utilizing a parasitic bipolar structure formed between the high-side ESD diode 202 and the chip substrate 204. In another embodiment, the rail-based ESD protection may be used in a number of semiconductor devices implementing high-speed or digital designs due to small capacitance and low leakage current. The parasitic PNP structure 210, as shown in FIG. 2, with a large periphery, inevitably exists in the layout due to the high-side diode in the rail-based IEC ESD protection scheme. However, the triggering of parasitic PNP devices is typically undesired during the ESD stress due to their un-controlled characteristics with non-uniform breakdown behaviors and low thermal failure current.

Figure 3:
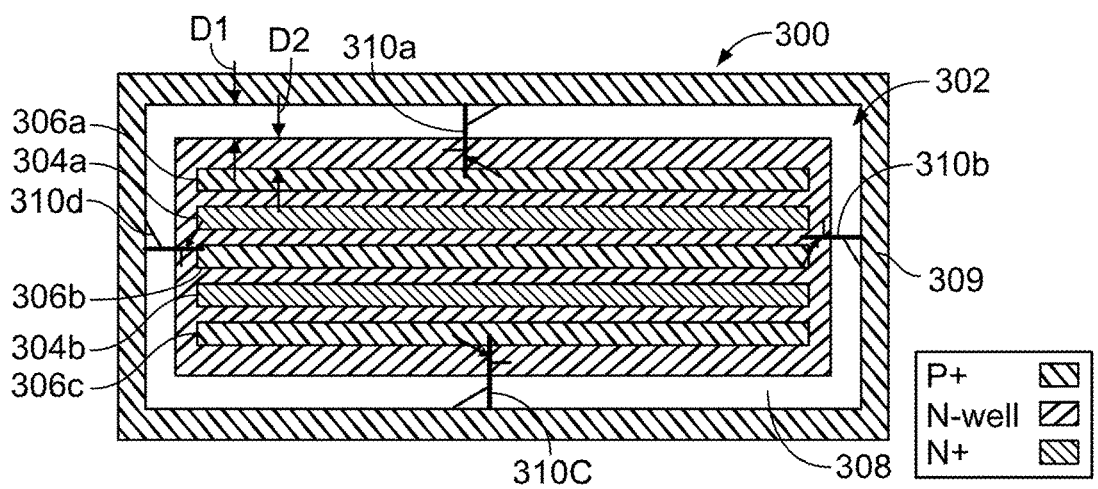
FIG. 3 illustrates a high-side diode layout with inherent parasitic PNP structures for an embodiment of the present invention.

FIG. 3 illustrates a high-side diode layout 300 with inherent parasitic PNP structures for an embodiment of the present invention. For this embodiment, the P+/N-well junction of the high-side diode 302 is designed with a plurality of alternating of N+ diffusions 304A-304B and P+ diffusions 306A-306C in N-well 308. The alternating diffusions may be in the shape of fingers, elongated structures such as rectangles and other shapes known to those of ordinary skill in the art. The N+ and P+ diffusions may be a spaced distance apart and interlaced.

Figure 1:
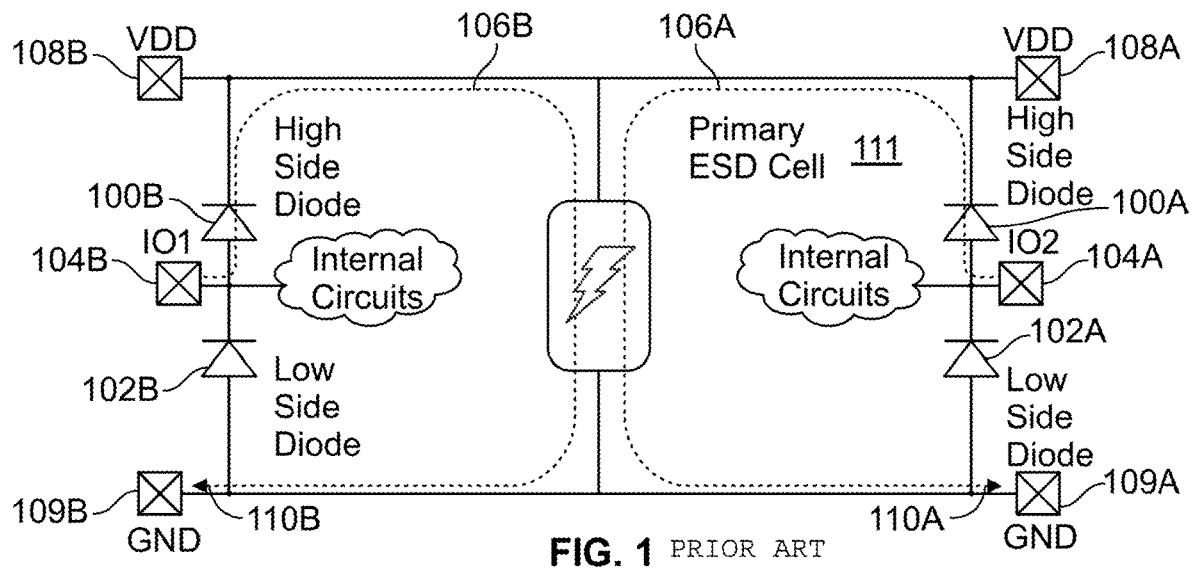
FIG. 1 illustrates a rail-based ESD protection scheme with a shared primary ESD cell.

Diode 302 is surrounded with P+ ring 309 for substrate contact. The resulting parasitic PNP structures 310A-310D create a large device periphery. However, the device parameters may be varied due to the geometry of substrate contacts and diode layout. In order to facilitate the ESD discharge current path indicated in FIG. 1, the parasitic PNP structure can be optimized to achieve high It2 and proper trigger voltage (Vt1PNP) with uniform turn-on characteristics.

The characteristics of parasitic PNP may be determined by the layout of high-side diodes. The current gain of the parasitic PNP structures can be adjusted through varying the width and doping for the emitter and base. For the embodiment shown in FIG. 3, the base width is affected by the distance from N-well 308 to P+ substrate contact 309 (d1) and the distance from N-well 308 to P+ diode contact 306A (d2). The emitter width is decided by the width of P+ diffusions in the high-side diodes. The base doping can be adjusted by the type of diffusions used for N-well, substrate contact, and guard rings. IEC ESD protection structures usually require strong guard rings around them to reduce the injections to the substrate and prevent latchups. The geometry and diffusions of the guard rings may also be changed to change the characteristics of parasitic PNP structures.

Figure 4:
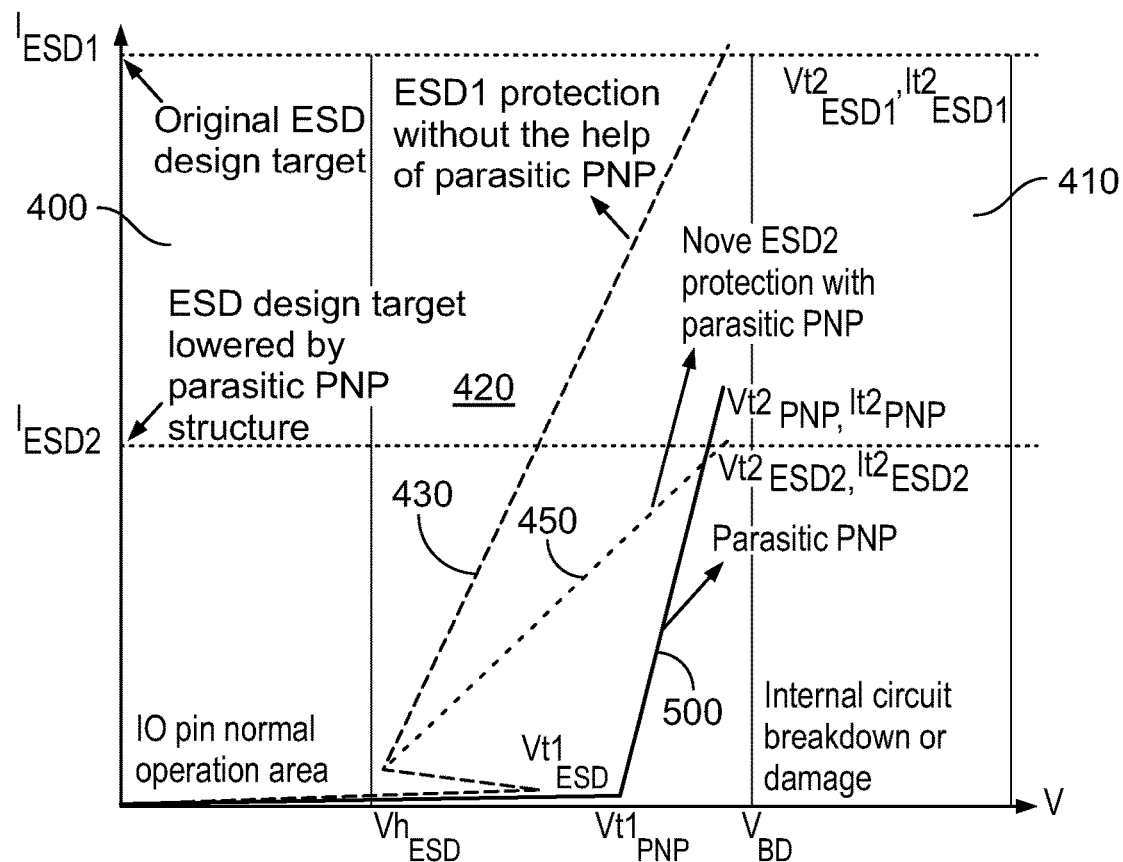
FIG. 4 illustrates an ESD protection window with the help of the parasitic PNP structures in parallel for an embodiment of the present invention.

In yet another embodiment of the present invention, a feature of the ESD solution is to create additional parallel ESD discharging paths formed by parasitic PNP that inherently exists in the rail-based ESD structure. For this embodiment, the approach is to tailor the characteristics of substrate PNP structures, such that the triggering and clamping voltages of the parasitic PNP structure are within the predetermined ESD protection window. The clamping voltage of the primary ESD protection path should be higher than the triggering voltage of the parasitic PNP device to guarantee the turn-on of PNP. FIG. 4 shows an ESD protection window with the parasitic PNP structures in parallel for a specific ESD design target (i.e., $I_{ESD1}$).

As shown in FIG. 4, area 400 is the normal operating area for the circuit, area 410 is the breakdown or failure region for internal circuits, and the characteristics of the ESD protection structure need to be designed within window 420. Curve 430 is the characteristics of original ESD1 without the turn-on of the parasitic PNP structure. A snapback-based primary ESD structure is used in the IEC protection scheme to fit into the protection windows. In order to meet the design target $I_{ESD1}$ (e.g. 30A), both dual-diodes and primary ESD cell need to be scaled up to increase current handling and reduce the on-resistance. A typical primary ESD cell for 8 kV IEC ESD protection can take around 0.2 mm² in area. The dual-diodes need to be large enough to lower the on-resistance and keep the ESD clamping voltage below the breakdown voltage (VBD). The area of dual-diodes with guard rings can be around 0.1 mm². To decrease the total ESD device areas, another embodiment of the present invention utilizes the inherent parasitic PNP structure in the high-side diode. The current-voltage (IV) characteristics of parasitic PNP will be adjusted to fit into the ESD protection window. The parasitic PNP structure typically exhibits a non-snapback IV characteristic (as shown by curve 500 in FIG. 4) due to a relatively low current gain compared to the NPN structure.

Through designing and optimizing the substrate contacts, type of diffusions, guard ring scheme and high-side diode layout, the current gain, uniformity and scalability of parasitic PNP can be improved. With the guidance from device simulations, a uniform current flow with high It2 on parasitic PNP may be achieved to help discharge the ESD current. The triggering voltage (Vt1PNP) will be decreased below VBD. A significant amount of IEC ESD current will be shunted by the parasitic PNP structure. There is no additional device area or metal interconnect required. The actual design target for IEC ESD structures is substantially dropped from IESD1 to IESD2 as indicated in FIG. 4. The area of both high-side diode and primary ESD cell can be significantly decreased (as shown by the dotted line 450 in FIG. 4) with the additional current discharge path through the parasitic PNP structure.

The circuit performance of high-speed interface ICs is highly impacted by the parasitic capacitance on the pin, which is mainly contributed by the ESD cells. The capacitance of ESD structure on IO pin is dominated by the capacitance of dual-diodes (i.e., high-side diode and low-side diode). With the proper design of parasitic PNP structures, the area of primary ESD cells can be reduced.

Figure 5:
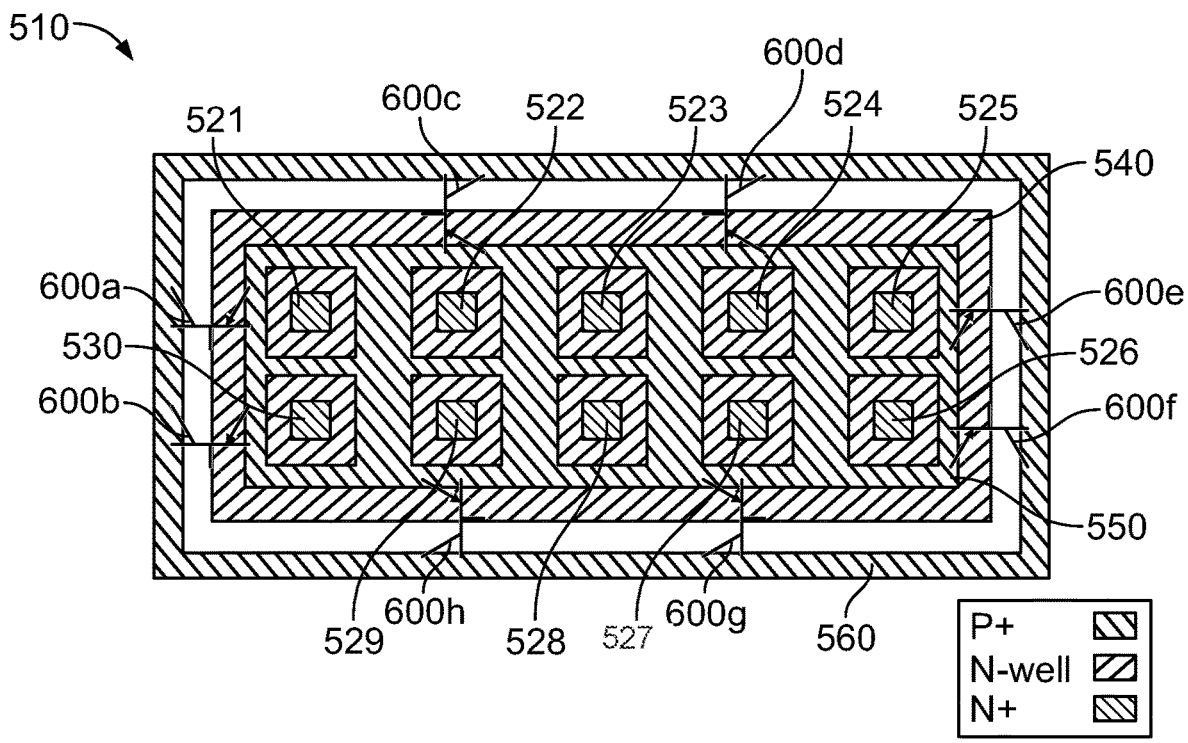
FIG. 5 illustrates a high-side diode layout for an embodiment of the present invention.

To reduce the ESD cell capacitance and further decrease the total ESD cell area, the layout of dual-diodes can be optimized using an "island" shape 510 layout structure as shown in FIG. 5 for another embodiment of the present invention. For this embodiment, the P+/N-well junction of the high-side diodes is designed with a plurality of alternating islands 521-530 of N+ diffusions in N-well 540. The islands are located in openings created by P+ diffusions having been arranged as intersecting segments 550.

In yet other embodiments, the P+ diffusions are comprised of segments arrange to create openings that surround the N+ diffusions. In other embodiments, the P+ diffusions are arranged to form a framework or grid 550 that surrounds the N+ diffusions in N-well 540. Also provided is P+ ring 560 that forms an opening that surrounds the P+ diffusions and N+ diffusions for substrate contact. The resulting parasitic PNP structures 600A-600H create a large device periphery.

The embodiment shown in FIG. 5 has been demonstrated to be more area-efficient in terms of It2 than the embodiment shown in FIG. 3. It was found that the island structures provide better uniformity and larger device periphery for parasitic PNP structures. Through optimizing the unit cell layout (i.e., active area, number of contacts) and the array of unit cells (i.e., geometry and metallization), dual-diodes need to be designed to avoid current crowding or high interconnect resistance.

In yet other aspects of the present invention, the embodiments of the present invention may be used in other designs that include adding N+ floating region to the right side of P+ diffusion in the p substrate or N+ bridging between p substrate and n-well.

Figure 6:
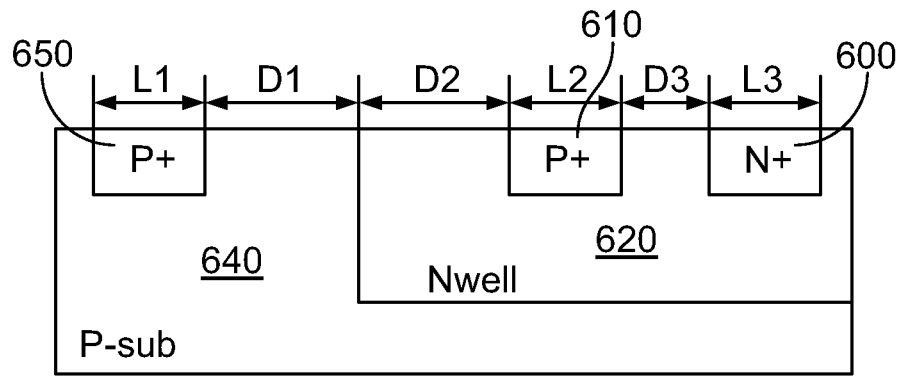
FIG. 6 shows the cross-section of a high-side diode with a parasitic PNP structure for an embodiment of the present invention.

FIG. 6 shows a cross-section of high-side diode with parasitic PNP structure. As shown, at least one N+ diffusion 600 and at least one P+ diffusion 610 are provided in N-well 620. Also provided is P+ ring 650 for P+ substrate contact 640.

FIG. 6 also shows the following: a semiconductor device comprising a P type substrate 650, an N type layer 620 on the substrate and forming a PN junction therewith; a P type region 610 formed in the N type layer 620 and serving as the emitter of a parasitic PNP transistor formed by the P type region 610, N type layer 620 and P type substrate 650. An N type region 600 may also be formed in N type layer 620.

Figure 7:
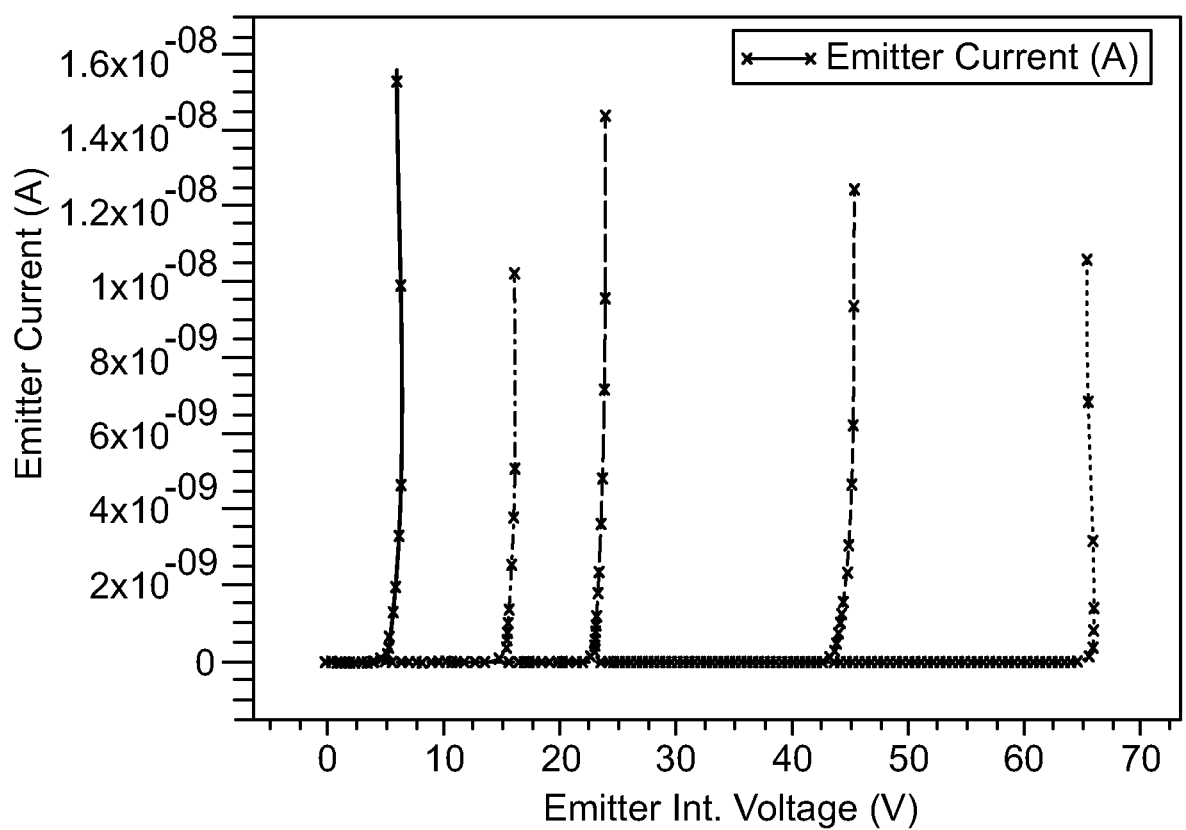
FIG. 7 illustrates how the triggering voltage of parasitic PNP is changed, with a distance between P+ to N-well.

FIG. 7 shows how the triggering voltage of parasitic PNP is changed with the distance between P+ diffusion to N-well distance. It has been found through device simulations that triggering voltage changes more rapidly with parameter D2 other than D1, L1, L2. FIG. 2 shows one simulation result for parameter D2 which has a significant impact on the triggering voltage.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A semiconductor device comprising:
   a P type substrate;
   an N type layer on said P type substrate and forming a PN junction therewith;
   a plurality of P type regions formed in said N type layer and wherein at least one of said plurality of P type regions serving as an emitter of at least one parasitic PNP transistor formed by said at least one of said plurality of P type regions, said N type layer, and said P type substrate;
   a plurality of N type regions formed in said N type layer; and
   wherein said plurality of N type regions arranged as a plurality of islands, and said plurality of P type regions arranged as intersecting segments creating openings in which said plurality of islands are located, and wherein said plurality of islands are surround by said plurality of P type regions.

2. The semiconductor device of claim 1, wherein said plurality of P type regions and said plurality of N type regions are spaced apart.

3. The semiconductor device of claim 1, wherein said plurality of P type regions and said plurality of N type regions are spaced apart and interlaced.

4. The semiconductor device of claim 3 wherein said plurality of P type regions and said plurality N type regions have an elongated configuration.

5. The semiconductor device of claim 3 wherein said plurality of P type regions and said plurality of N type regions are arranged as fingers in said N type layer.

6. The semiconductor device of claim 3 further including a plurality of parasitic PNP transistors.

7. The semiconductor device of claim 4 further including a plurality of parasitic PNP transistors.

8. The semiconductor device of claim 5 further including a plurality of parasitic PNP transistors.

9. The semiconductor device of claim 1 further including a plurality of parasitic PNP transistors.

10. The semiconductor device of claim 9 wherein said plurality of parasitic PNP transistors are in parallel.

11. The semiconductor device of claim 6 further including a primary ESD protection path having a clamping voltage, said clamping voltage of said primary ESD protection path is higher than a triggering voltage of said plurality of parasitic PNP transistors.

12. The semiconductor device of claim 9 further including a primary ESD protection path having a clamping voltage, said clamping voltage of said primary ESD protection path is higher than a triggering voltage of said plurality of parasitic PNP transistors.

13. The semiconductor device of claim 1 further including an N type floating region to a side of said plurality of P type regions in said P type substrate.

14. The semiconductor device of claim 1 further including an N type bridging between said P type substrate and said N type layer.

* * * * *